United States Patent

[11] 3,588,733

[72] Inventors Rex J. Crookshanks
Palos Verdes;
Don G. Roberts, Glendale, Calif.

[21] Appl. No. 872,480
[22] Filed Oct. 31, 1969
[45] Patented June 28, 1971
[73] Assignee The United States of America as represented by the Secretary of the Navy

[54] MULTIPHASE VOLTAGE CONTROLLED OSCILLATOR
5 Claims, 3 Drawing Figs.

[52] U.S. Cl. .......... 331/2, 331/45, 331/56, 331/36C
[51] Int. Cl. .......... H03b 3/04, H03b 27/00
[50] Field of Search .......... 331/2, 45, 56

[56] References Cited

OTHER REFERENCES

G. F. Straube, " A Voltage Variable Capacitor", Electronic Industries May 1958, Pgs. 69— 73

*Primary Examiner*—John Kominski
*Attorneys*—R. S. Sciascia and H. H. Losche

ABSTRACT: A multiphase voltage controlled oscillator having a resistance matrix coupled at input points to the outputs of automatic gain controlled amplifier-oscillators and at output points to phase shifting networks, the phase shifting network outputs being coupled to the amplifier-oscillators to provide regenerative feedbacks and produce a plurality of phase related voltages. The automatic gain controlled amplifiers are differential amplifiers to provide two phase outputs 180° apart and the phase shifters include back-to-back Varicaps as capacitance with a controlled direct current DC imposed at their common back-to-back junction to vary the capacity thereof in accordance with any phase error detected between one of the amplifier-oscillator outputs and a single phase reference frequency.

Patented June 28, 1971 3,588,733

2 Sheets-Sheet 1

INVENTORS
REX J. CROOKSHANKS
DON G. ROBERTS

BY H. H. Losche

ATTORNEY

INVENTORS
REX J. CROOKSHANKS
DON G. ROBERTS

BY H. H. Losche

ATTORNEY

MULTIPHASE VOLTAGE CONTROLLED OSCILLATOR

BACKGROUND OF THE INVENTION

This invention relates to voltage controlled oscillators (VCO) and more particularly to multiphase VCOs.

In prior known polyphase oscillators, tube or transistor oscillator circuits are constructed and arranged with resistance and capacitance networks coupled thereto to produce phase relation between the outputs of the tube or transistor oscillator circuits. Some of these polyphase circuits produce related oscillations in sequence or have phase shifting circuits to shift the phase of down-the-line oscillators in a ring-type oscillator system. In some circuits the resistive element of the timing circuits is a 360° potentiometer that is driven to change the timing of the oscillators to produce phase change. While polyphase oscillators are known and used, they have disadvantages of instability or drift of the phase relation and a complication of parts to achieve two or more phase oscillations.

SUMMARY OF THE INVENTION

In the present invention a resistance matrix, used in conjunction with Varicaps of phase shifter networks, produces the proper phase relations to phase four amplifier-oscillators for the generation of two 180° out-of-phase outputs for each oscillator with the corresponding phase of each oscillator being 45° apart to provide a multiphase output of eight phases 45° apart. These eight multiphase outputs can be converted by use of another resistance matrix into nine output phases 40° apart. The amplifier-oscillators are automatic gain controlled (AGC) differential amplifiers with a regenerative feedback through the resistance matrix. One of the oscillator phased outputs is compared with a reference oscillator output and any phase difference is detected in a DC output to control the bias voltage on all the Varicaps to maintain all oscillator outputs in a predetermined relation with the reference oscillator. It is a general object of this invention to provide a multiphase VCO in which the phases are relatively locked-in with respect to each other and voltage controlled with respect to a reference oscillation to generate accurately related polyphase voltage oscillations.

BRIEF DESCRIPTION OF THE DRAWINGS

These and other objects and the attendant advantages, features, and uses will become more apparent as a more detailed description is given when considered along with the accompanying drawings in which.

Figure 1:
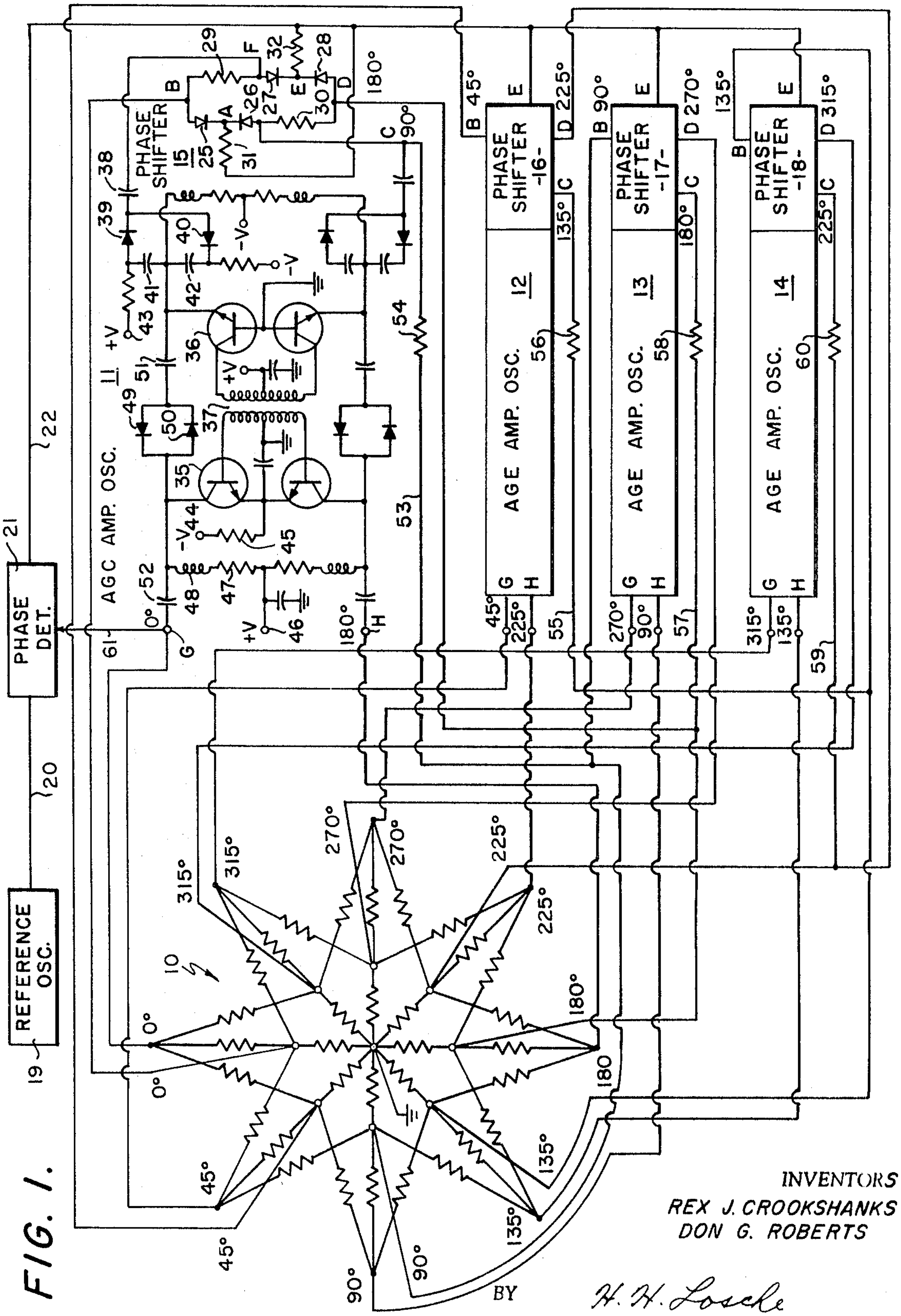
FIG. 1 is a partially schematic and partially block diagram of the multiphase VCO of this invention.

Referring more particularly to FIG. 1, the multiphase VCO combination is shown as having a resistance matrix 10; four AGC amplifier-oscillator circuits 11, 12, 13, and 14; four phase shifting networks 15, 16, 17, and 18 coupled respectively to the four AGC amplifier-oscillator circuits; a reference oscillator 19 having an output 20; and a phase detector 21 having an output 22. The resistance matrix 10 is shown herein in the formation of an eight-pointed star having inputs at the points of the star herein designated in degrees 0°, 45°, 90°, and so on around through 315° on the eighth star point. Output terminals are shown as taken from the base of the star points and these are likewise designated as 0°, 45°, 90° and so on through 315° outputs. As may be seen in the matrix 10, each output terminal consists of a junction point of five resistance terminal points. The resistive matrix averages the phase errors from the input signals and signal distortion is minimized since the resistive matrix will cancel the signal harmonics of the fundamental which may be generated in other areas of the system.

The phase shifters 15 through 18 are identical, only the phase shifter 15 being shown in detail and the description will be given only for this phase shifter. The phase shifter 15 consists of two pairs of Varicaps in back-to-back relation consisting of the Varicaps 25,26 and 27,28. Separating these pairs of Varicaps are resistors 29 and 30. One input to the phase shifter is at terminal B and a second terminal input to the phase shifter is shown by the terminal D. Two outputs C and F are taken from the phase shifter at terminal points joining one each pair of Varicaps and its adjacent resistance. Terminals A and E are taken from the back-to-back connection of each pair of Varicaps through resistors 31 and 32 to the phase detector output conductor 22. For the purpose of example of the connection herein, the input terminal B is coupled to the 0° output of the resistance matrix 10, and the input terminal D of the phase shifter 15 is coupled to the 180° output terminal of the resistance matrix 10. Similar connections are made to the phase shifters 16 through 18 as may be seen in FIG. 1 wherein the B input terminal of phase shifter 16 is coupled to the 45° output of phase shifter 10 while input terminal D is coupled to the 225° output of the matrix 10. In like manner the B terminal of phase shifter 17 is coupled to the 90° output and the D terminal input of phase shifter 17 is coupled to the 270° output of matrix 10. Again, the B input to phase shifter 18 is coupled to the 135° output while the D input is coupled to the 315° output of the matrix 10. It may be realized from the description that the two inputs to each of the phase shifters are 180° out of phase but that the related B and D terminals of the four phase shifters have separations of 45° accounting for 45° separation through the full 360°. The output from the phase detector 22 is a DC potential and is applied in parallel to the four phase shifters at terminals A and E to synchronize the phase relationship thereof with the phase of the reference oscillator 19. To accomplish this it is only necessary to compare the phase of only one output from the AGC amplifier-oscillator circuits as will later be more fully described in detail.

The AGC amplifier oscillator circuits 11 through 14 are identical and accordingly only the circuit schematic of the AGC amplifier-oscillator 11 will be described in detail herein. Each AGC amplifier-oscillator consists of a differential amplifier having NPN transistors 35 and 36 coupled by the transformer 37. Only the top half of the differential amplifier and oscillator circuits will be described herein since each element has its counterpart in the lower half of the circuit and will operate in the same way. The input to the emitter of transistor 36 is from the output F of phase shifter 15 through a coupling capacitors 38, oppositely oriented diodes 39 and 40, and capacitors 41 and 42. The input diodes 39 and 40 are biased with a DC current from a +V source at terminal 43. The capacitors 41 and 42 insure the flow of this DC current through each input diode 39 and 40. This phase signal from F applied to the emitter of transistor 36 is amplified and conducted through the coupling transformer 37 to the base of the transistor 35 which has a common emitter coupling that is biased from a −V source at terminal 44 through a resistor 45. The collector of transistor 35 is supplied voltage from a +V source from terminal 46 through a resistor 47 and an inductance 48. The inductive chokes 48 provided in the collector circuits of the output stage takes advantage of the time delay of the stage so that an approximate fixed phase output exists over the wide frequency range. The collector output of the transistor 35 is fed back through oppositely oriented diodes 49 and 50 and through a coupling capacitor 51 to the emitter of transistor 36 to provide the AGC control of this amplifier. The common emitter differential amplifier provides the required current gain of the amplifier plus some voltage gain. The output of the amplifier is through a coupling capacitor 52 and is designated as G which is coupled to the 0° input of the resistance matrix 10. Each amplifier should exhibit a 180° phase shift from input to output of the range of operating frequencies. Due to the physical characteristics of the active device used in the construction there will be a time delay factor associated with the 180° phase shift. For best averaging of the output phases the phase shifting network described previously is designed such that its midrange value corresponds to the midrange value of phase shift through the amplifiers. The AGC control of each amplifier maintains the overall loop gain of unity. The amplifier-oscillator circuit, being constructed as a differential amplifier, provides a second output identified by the reference character H and will be connected to the 180° point input terminal of the resistance matrix 10. In like manner the G output of oscillator 12 will be coupled to the 45° input of matrix 10 while the H output of oscillator 12 will be coupled to the 225° input of matrix 10. For the oscillator 13, the G output is coupled to the 270° point input of matrix 10 while the H output is coupled to the 90° point input of matrix 10. In similar manner for oscillator 14, G is coupled to the 315° point input and H is coupled to the 135° point input of matrix 10. The output C of the phase shifter 15 is coupled as an input to the lower half of the AGC amplifier-oscillator circuit 11 and is likewise coupled by conductor 53 through a resistor 54 to the 90° terminal output of the resistance matrix 10. Similarly the C terminal of phase shifter 16 is coupled by a conductor 55 through a resistor 56 to the 135° output terminal of the resistance matrix 10. Terminal C of phase shifter 17 is coupled by the conductor 57 through a resistor 58 to the 180° output terminal of resistance matrix 10. Terminal C of phase shifter 18 is coupled by the conductor means 59 through resistor 60 to the 225° output terminal of resistance matrix 10. It may be seen from this description that the inputs to each phase shifter are 180° apart and that the phase shifter through the related oscillator circuit produces outputs 180° apart with a phase separation between the several phase shifter and oscillator circuits of 45°. In a multiphase VCO, sequence of rotation as well as oscillatory conditions must be satisfied. This is accomplished by feeding a signal from the resistive matrix 10 across the all-pass phase shifter. This signal has a relative phase spacing of 90° compared to the signal feeding the all-pass phase shifter. If the relative phase of the shunting signal is +90°, then the multiphase VCO will have one sequence of oscillation; and if the shunting signal is −90°, then the multiphase VCO will have the reverse sequence of oscillation. It may be seen from the above description that the resistive matrix is in a regenerative loop through the phase shifter from the output, i.e., G, to the input, i.e., B, of phase shifter 15 for the AGC amplifier-oscillator circuit 11. In like manner each amplifier-oscillator has a portion of the resistance matrix 10 and the related phase shifter in the regenerative feedback circuit. The resistive matrix 10 is of a design such that the attenuation and regeneration circuit meets the closed loop gain requirement for oscillation. The output G of oscillator 11 is coupled by a conductor 61 as a second input to the phase detector 21 for detecting any phase difference between the single phase reference oscillator 19 and the phase on the output G from the oscillator 11. The essential idea used in generating the reference frequency is to phase-lock the multiphase VCO to a desired single phase reference frequency, as generated by the reference oscillator 19. It may be seen, then, that the multiphase VCO is phase-locked with reference to the reference oscillator 19 frequency and any phase difference detected will produce a DC voltage on output 22 of the phase detector 21 biasing the back-to-back Varicaps all in common to shift the phase in the phase shifters in an amount to correct for all output phases of the four AGC amplifier-oscillator circuits 11 through 14 since these circuits are phase-locked with each other through the E inputs and by virtue of the phase related outputs of the resistance matrix 10. Accordingly, the G and H outputs of the four AGC amplifier-oscillator circuits 11 through 14 will produce a phase of eight voltages, phase separated 45° apart. While FIG. 1 has the phase relations shown in diagram, it is to be understood that the actual phase relations may be connected differently as by rotating the input and output phases in one direction or the other around the resistance matrix 10.

Figure 2:
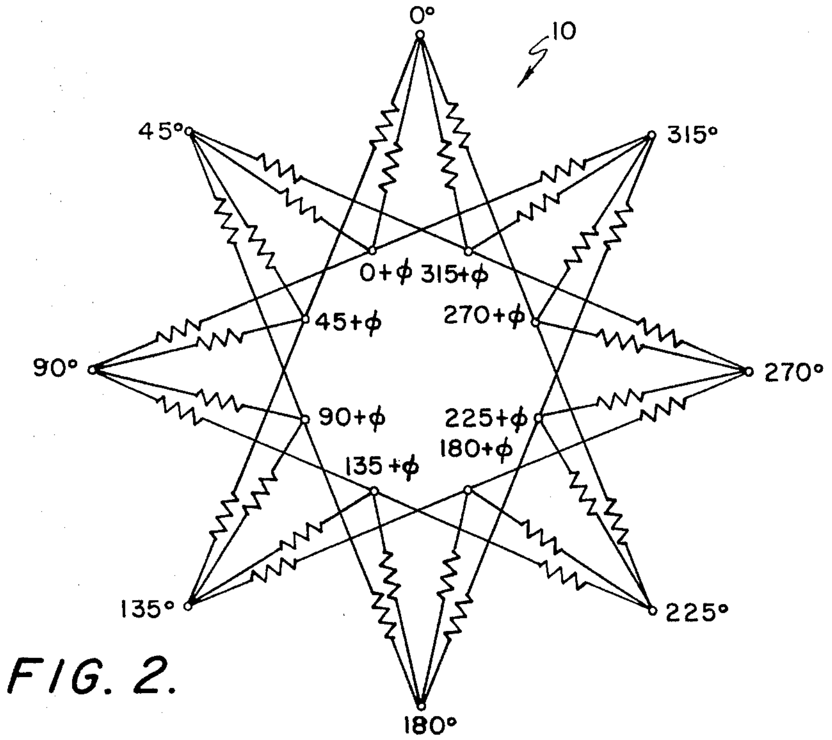
FIGS. 2 and 3 show modifications of the resistance matrix of FIG. 1.

FIG. 2 shows a modification of the resistance matrix 10 in which the central complex of resistances have been eliminated. In this FIG. each output is shown as having the input phase plus a phase Φ which is the phase at a related nodal point produced by the admittance resulting from the summing of the resistors. This phase shift Φ is nominal and is only mentioned in conjunction with this FIG. although this is involved in the phase shifter 10 of FIG. 1 as well.

Figure 3:
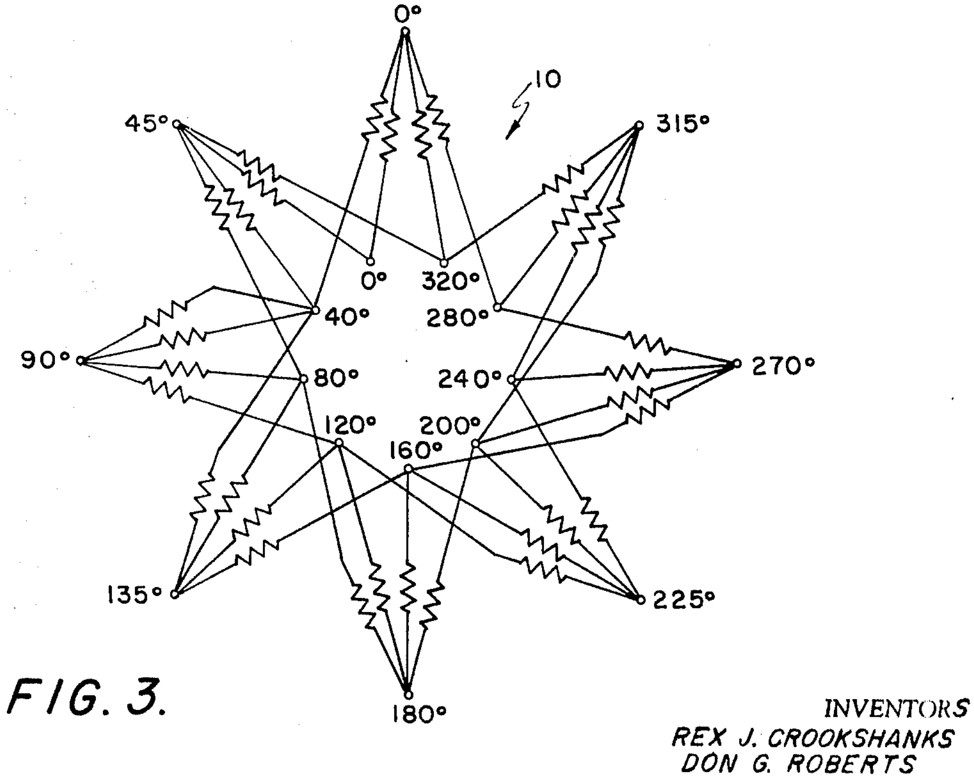

FIG. 3 shows a further modification of the resistance matrix 10 to provide nine outputs with a phase separation of 40° from an eight-phase input to the matrix.

OPERATION

Let it be assumed that the phases on the inputs and outputs of the resistance matrix, as well as phase shifter and the AGC amplifier-oscillator circuits, are as designated on the terminal points of FIG. 1. The application of plus and minus voltages to the various terminals 43,44, and 46, of the oscillator circuits will start oscillations to produce the G and H output phases as shown in this FIG. The regenerative feedback through the resistance matrix will produce output voltages of the phases shown through the several phase shifters to the AGC amplifier-oscillator circuits to maintain the output of the oscillator in the phase shown. In the multiphase VCO oscillator circuit shown in FIG. 1, the frequency range chosen was 30 megacycles (Mc.) to 54 Mc. although other ranges may be used without departing from the spirit of this invention. If at any time the output phase G from 11 is off of 0° from the reference oscillator generating a 0° single phase of frequency, a DC voltage will be produced on the output 22 of the phase detector 21 to produce a voltage bias on the terminal points of all back-to-back Varicaps in the phase shift circuits to correct the output G voltage to the 0° phase, and in like manner will correct all other output G and H voltages to their proper phases, as illustrated in FIG. 1. In this manner a multiphase VCO oscillator of eight phases will maintain these eight phases in proper phase relationship with a single-phase reference oscillator frequency to provide very accurate phase relations in the eight output phases or, where a resistance matrix 10 as shown in FIG. 3 is used, nine accurately separated output phases 40° apart can be produced.

The above-described multiphase VCO with the modifications of FIGS. 2 and 3 illustrate and describe in detail the preferred embodiment of applicants' invention which they particularly define in the appended claims.

We claim:

1. A multiphase automatic gain controlled oscillator circuit comprising:

a resistance matrix having a plurality of inputs and outputs;

a plurality of amplifier-oscillator circuits, one each having an output coupled to an input of said resistance matrix, and one each having an input;

a plurality of phase shifters, each having an input coupled to an output of said resistance matrix, each having an output coupled as an input to one each amplifier-oscillator input, and each having a pair of back-to-back voltage variable capacitive junction devices therein with a voltage control input at the junction thereof, said output of each said amplifier-oscillator through said resistance matrix and said phase shifter to the input thereof constituting a regenerative feedback circuit;

a reference oscillator having an output; and a phase detector having inputs coupled to the output of said reference oscillator and to one output of said plurality of amplifier-oscillator circuits with an output coupled in common to all voltage control inputs of said voltage variable capacitive junction devices to produce a direct current voltage output for any phase difference between said reference oscillator frequency and the frequency of said one output whereby an oscillating voltage is developed on the output of each amplifier-oscillator circuit at a predetermined phase angle from all other oscillator outputs to produce a multiphase output of voltage oscillations.

2. A multiphase automatic voltage controlled oscillator circuit as set forth in claim 1 wherein said plurality of amplifier-oscillator circuits are differential amplifier-oscillators generating two outputs from two inputs thereto each with a phase relation of 180°and each differential amplifier-oscillator being phase related by equal degrees of separation.

3. A multiphase automatic voltage controlled oscillator circuit as set forth in claim 2 wherein said phase shifters each have two pairs of back-to-back voltage variable capacitive junction devices separated by resistances in a closed loop circuit, the inputs thereto being at one set of opposite junctions of each voltage variable capacitive junction device pair and the adjacent resistance, and the outputs therefrom being at the other set of opposite junctions of each voltage variable capacitive junction device pair and the adjacent resistance providing two outputs coupled to said two inputs of each differential amplifier-oscillator.

4. A multiphase automatic voltage controlled oscillator circuit as set forth in claim 3 wherein said resistance matrix is a star configuration with input terminals at the star points and output terminals at points within the star interconnected with each other and with the inputs through resistors, the resistor combination for each output being operative together with the voltage variable capacitive junction devices in each phase shifter to produce a resistance-capacitance component for phase shifting said resistance matrix outputs for each amplifier-oscillator in accordance with said direct current control voltage.

5. A multiphase automatic voltage controlled oscillator circuit as set forth in claim 4 wherein said amplifier-oscillator pairs each have two inputs corresponding to the two said outputs thereof with said two inputs coupled, respectively, to the two outputs taken from the corresponding phase shifter, said phase shifter outputs being 180° out of phase with one of said phase shifter outputs being coupled to one of said resistance matrix outputs of the same phase.